US009753895B2

(12) United States Patent
Kuo et al.

(10) Patent No.: US 9,753,895 B2
(45) Date of Patent: Sep. 5, 2017

(54) METHOD FOR PROCESS VARIATION ANALYSIS OF AN INTEGRATED CIRCUIT

(71) Applicant: Taiwan Semiconductor Manufacturing Co., Ltd., Hsin-Chu (TW)

(72) Inventors: Chin-Cheng Kuo, Taoyuan (TW); Kmin Hsu, Hsinchu (TW); Wei-Yi Hu, Zhubei (TW); Wei Min Chan, Sindian (TW); Jui-Feng Kuan, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 33 days.

(21) Appl. No.: 14/818,349

(22) Filed: Aug. 5, 2015

(65) Prior Publication Data

US 2015/0339414 A1   Nov. 26, 2015

Related U.S. Application Data

(63) Continuation-in-part of application No. 14/492,866, filed on Sep. 22, 2014, now Pat. No. 9,519,735.
(Continued)

(51) Int. Cl.
*G06F 17/50* (2006.01)
*G06F 17/18* (2006.01)

(52) U.S. Cl.
CPC .......... *G06F 17/18* (2013.01); *G06F 17/5009* (2013.01); *G06F 17/5036* (2013.01)

(58) Field of Classification Search
CPC .. G06F 17/5009; G06F 2217/12; G06F 17/18; G06F 17/5022; G06F 17/5045;
(Continued)

(56) References Cited

U.S. PATENT DOCUMENTS

2005/0128489 A1   6/2005   Bao et al.
2005/0273308 A1*  12/2005  Houston ............... G06F 17/504
                                                        703/14
(Continued)

OTHER PUBLICATIONS

"Monte Carlo Simulation in HSPICE." Analog Integrated Circuits Design, Fall 2007.
(Continued)

*Primary Examiner* — Nghia Doan
(74) *Attorney, Agent, or Firm* — Eschweiler & Potashnik, LLC

(57) ABSTRACT

A method and a corresponding system for process variation analysis of an integrated circuit are provided. A netlist is generated describing electronic devices of an integrated circuit in terms of device parameters and process parameters. The process parameters include local process parameters individual to the electronic devices and global process parameters common to the electronic devices. Critical electronic devices are identified having device parameters with greatest contributions to a performance parameter of a design specification of the integrated circuit. Sensitivity values are determined for the global process parameters and local process parameters of the critical electronic devices. The sensitivity values represent how sensitive the one or more performance parameters are to variations in the global and local process parameters of the critical electronic devices. Monte Carlo (MC) samples are sorted based on the sensitivity values.

19 Claims, 11 Drawing Sheets

Related U.S. Application Data

(60) Provisional application No. 61/946,348, filed on Feb. 28, 2014.

(58) Field of Classification Search
CPC ...... H01L 22/20; Y02P 90/26; G03F 7/70441; G03F 7/705
USPC .................................................. 716/56, 136
See application file for complete search history.

(56) References Cited

U.S. PATENT DOCUMENTS

| | | | |
|---|---|---|---|
| 2008/0195359 A1* | 8/2008 | Barker | G05B 17/02 703/2 |
| 2008/0295046 A1 | 11/2008 | Su et al. | |
| 2011/0289463 A1 | 11/2011 | Cases et al. | |
| 2013/0226544 A1* | 8/2013 | McConaghy | G06F 17/5022 703/2 |

OTHER PUBLICATIONS

Wikipedia.org. "PSpice." Jul. 16, 2013.
U.S. Appl. No. 14/492,866, filed Sep. 22, 2014.
Non Final Office Action Dated Mar. 24, 2016 U.S. Appl. No. 14/492,866.
Notice of Allowance Action Dated Aug. 8, 2016 U.S. Appl. No. 14/492,866.

* cited by examiner

546 →

```
.subckt top (nodes)                                             548
xn1 (nodes) nch_svt_mac (size)
+par1=global_par1  par2=global_par2
+par1=top.xn1_par1  par2=top.xn1_par2  delvtrand=top.xn1_delvtrand      } 540' xp2 (nodes) pch_svt_mac  (size)
+par1=global_par1  par2=global_par2
+par1=top.xp2_par1  par2=top.xp2_par2                                   } 542'
                                                    552
xc1 (nodes) cfmom_wo (size)
+parl_fmom=global_parl_fmom
+parl1_fmom=top. xc1_parl1_fmom                                         } 544'
.ends top  550

.parameter
+ top.xn1_delvtrand=0
+ top.xp2_delvtrand=0                          } 556

+ global_parl1=0  global_par2=0  global_parl_fmom=0    ] 560

+ top.xn1_parl1=0  top.xn1_parl2=0
+ top.xp1_parl1=0  top.xp1_parl2=0             } 558
+ top.xc1_parl1_fmom=0
.END
```

⇑ restructuring

538 {
554 {

536 →

```
.subckt top (nodes)
xn1 (nodes) nch_svt_mac (size)    ] 540
xp2 (nodes) pch_svt_mac  (size)   ] 542
xc1 (nodes) cfmom_wo    (size)    ] 544
.ends top
```

```
.subckt A (nodes)
xn1  A  (nodes) nch_svt_mac (size) ⎦568
xp2  A  (nodes) pch_svt_mac (size) ⎦570
xc1  A  (nodes) cfmom_wo     (size) ⎦572
.ends A
```
564 {

```
.subckt top (nodes)
xi1  top.xi1.A (nodes) ⎦574
xi2  top.xi2.A (nodes) ⎦576
xn1  A (nodes) nch_svt_mac (size) ⎦578
.ends top
```
566 {

⇩ restructuring

580

```
.subckt top.xi1.A (pins)
  597      596
xn1 (nodes) nch_svt_mac (size)
 +par1=global_par1 [par2]=global_par2
 +[par1]=top.xi1.A.xn1_par1 par2=top.xi1.A.xn1_par2 delvtrand=top.xi1.A.xn1_delvtrand
xp2 (nodes) pch_svt_mac (size)
 +par1=global_par1 par2=global_par2
 +par1=top.xi1.A.xp2_par1 par2=top.xi1.A.xp2_par2 [delvtrand]=top.xi1.A.xp2_delvtrand
                                                        598
xc1 (nodes) cfmom_wo (size)
 +par1_fmom=global_par1_fmom
 +par1_fmom=top.xi1.A.xc1_par1_fmom
.ends top.xi1.A
```
582 { ⎱586
       ⎰588
       ⎱590

```
.subckt top.xi2.A (nodes)
xn1 (nodes) nch_svt_mac (size)
 +par1=global_par1 par2=global_par2
 +par1=top.xi2.A.xn1_par1 par2=top.xi2.A.xn1_par2 delvtrand=top.xi2.A.xn1_delvtrand
xp2 (nodes) pch_svt_mac (size)
 +par1=global_par1 par2=global_par2
 +par1=top.xi2.A.xp2_par1 par2=top.xi2.A.xp2_par2 delvtrand=top.xi2.A.xp2_delvtrand
xc1 (nodes) cfmom_wo (size)
 +par1_fmom=global_par1_fmom
 +par1_fmom=top.xi2.A.xc1_par1_fmom
.ends top.xi2.A
```
584 { ⎱592
       ⎰594
       ⎱595

```
.subckt top (nodes)
xi1  top.xi1.A (nodes) ⎦574'
xi2  top.xi2.A (nodes) ⎦576'
xn1 (nodes) nch_svt_mac (size)
 +par1=global_par1 par2=global_par2
 +par1=top_new.xn1_par1 par2=top_new.xn1_par2 delvtrand=top_new.xn1_delvtrand
.ends top
```
566' { ⎱578'

```
.parameter
(user-defined parameters)
.END
```
599

Fig. 5C

METHOD FOR PROCESS VARIATION ANALYSIS OF AN INTEGRATED CIRCUIT

RELATED APPLICATIONS

This application is a continuation-in-part of U.S. application Ser. No. 14/492,866, filed on Sep. 22, 2014, which claims the benefit of: 1) U.S. Provisional Application No. 61/946,348, filed on Feb. 28, 2014; and 2) U.S. Provisional Application No. 61/881,091, filed on Sep. 23, 2013. This application hereby incorporates by reference all subject matter of the U.S. Applications.

BACKGROUND

An integrated circuit is often designed to meet or exceed certain design specifications. For example, an integrated circuit may be designed to produce a voltage gain of between 10 and 15 from the input to the output of the integrated circuit. However, during the bulk manufacture of an integrated circuit, unpredictable variations in an IC fabrication process may result in a low yield (i.e., a high percentage of the chips failing to meet or exceed the design specifications). Therefore, before the bulk manufacture of an integrated circuit, yield may be predicted using computer simulation. If the predicted yield is low, the manufacturing process and/or the integrated circuit design can be refined. Such simulation is expected to become increasingly important as feature sizes become smaller and process variations become even more pronounced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B & C illustrate some embodiments of netlists before and after restructuring corresponding to the method of FIG. 5A.

DETAILED DESCRIPTION

Figure 1:
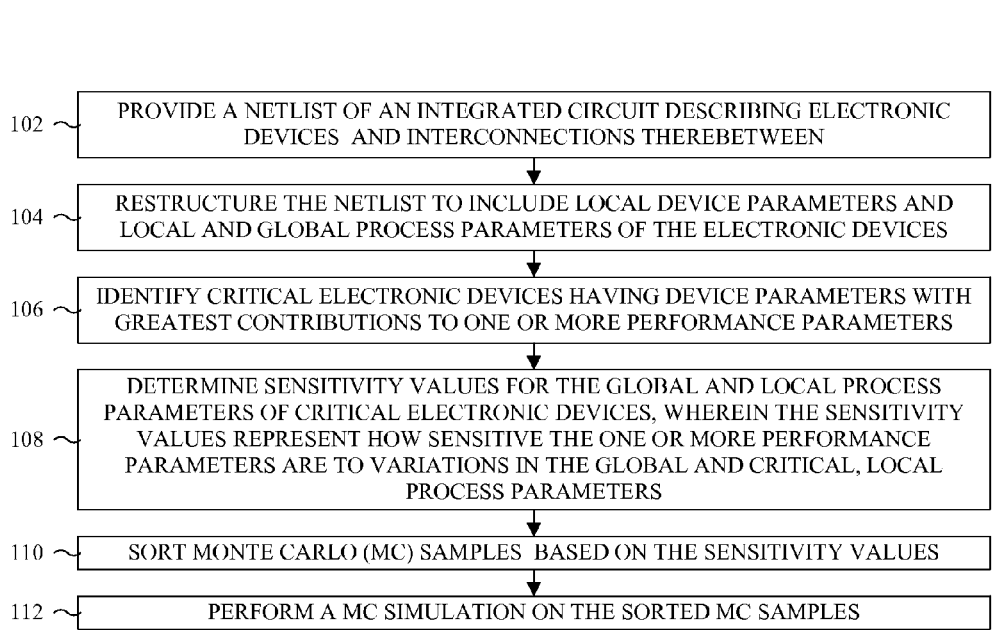
FIG. 1 illustrates a flowchart of some embodiments of a method of performing a process variation analysis of an integrated circuit.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Typically, Monte Carlo (MC) simulations for predicting a yield of an integrated circuit use a netlist describing the interconnection of one or more electronic devices corresponding to different device types, and process models that describes a relationship between terminals of a device type based on process parameters defining the process for manufacturing the device type. With the netlist and the process models, a MC simulation may randomly generate MC samples capturing process variations and may process the MC samples until a stopping condition is reached. To process a MC sample, process parameters within the netlist are set to corresponding values of the MC sample and the netlist is simulated to determine values for one or more performance parameters. The one or more performance parameters are compared to a design specification to determine whether the MC sample meets the design specification. For example, a design specification calling for a voltage gain of between 10 and 15 would be met by a MC sample resulting in a performance parameter value of 13 for voltage gain. Once the stopping condition is reached, a yield is calculated as the ratio of MC samples that meet the design specification to the total number of MC samples processed.

Predicting yield by such a method is a computationally intensive, slow process that leads to slow design iterations. This is because all MC samples are processed before predicting yield, and also because both local process parameters (i.e., parameters specific to individual electronic devices of an integrated circuit) and global process parameters (i.e., parameters common to all electronic devices of an integrated circuit) are taken into account.

In various embodiments, the present application is directed to a method for process variation analysis (e.g., yield prediction), as well as a system employing the method. In some embodiments, the method streamlines a MC simulation process by sorting or ranking MC samples (i.e., placing MC samples in an order) according to their impact on the simulation (i.e., their proximity to limits of a design specification) to avoid time wasted on non-critical MC samples. Advantageously, by ranking the MC samples, critical MC samples are considered first, and fewer MC samples need to be considered to achieve a target accuracy and/or a target confidence. Further, in some embodiments, by limiting the processing to global process parameters (a parameter with a scope encompassing electronic devices of an integrated chip) and local process parameters (parameters with a value limited to an individual electronic device of an integrated chip) of critical devices, the set of possible MC samples may be reduced in size further reducing time of a MC simulation process. Collectively, the foregoing optimizations allow yield to be predicted more quickly, which allows faster design iterations.

Further, in some embodiments, the method identifies local process parameters of critical electronic devices having a greatest contribution to one or more performance parameters of a design specification. Sensitivity values, representing how sensitive one or more performance parameters are to variations in the process parameters, are then determined for global process parameters and for local process parameters of critical electronic devices. Further, MC samples are generated. With the MC samples and the sensitivity values, the MC samples are sorted from most critical MC samples (i.e., MC samples proximate limits of the design specification) to least critical MC samples. A MC simulation is then performed on the sorted MC samples until a stopping condition is reached.

With reference to FIG. 1, a flowchart 100 of some embodiments of a method for performing a process variation analysis of an integrated circuit is provided.

At 102, a netlist is provided. The netlist describes electronic devices and interconnections between the electronic devices.

At 104, in some embodiments, the netlist is restructured to include device parameters and process parameters of the electronic devices. Device parameters describe the structure or operation of the electronic devices, and process parameters describe the process for manufacturing the electronic devices. The device parameters include parameters global to electronic devices of the netlist. The process parameters include parameters local to one or more of the electronic devices and parameters global to the electronic devices of the netlist.

At 106, critical electronic devices are identified as those having device parameters with largest contributions to one or more performance parameters of a design specification. The critical electronic device may be identified by simulating the restructured netlist with first models (e.g., with device models defined in terms of device parameters) to determine first baseline values for the one or more performance parameters. First parameter values for the one or more performance parameters are then determined by performing individual simulations in which the device parameters are modified one at a time, while the other device parameters are set to initial values. The first parameter values are compared to corresponding first baseline values to determine the contributions of the device parameters and to identify the critical devices.

At 108, sensitivity values are determined for the global process parameters and the local process parameters of the critical electronic devices. The sensitivity values represent how sensitive the one or more performance parameters are to variations in the global process parameters and local process parameters of critical electronic devices. The sensitivity values may be determined by simulating the restructured netlist with second models (e.g., with process models defined in terms of process parameters) to determine a second baseline values for the global and critical local process parameters. Second parameters values are then determined by performing individual simulations in which the global process parameters and the local process parameters of critical electronic devices are modified one at a time, while the other process parameters are set to initial values. The second parameter values are compared to corresponding second baseline values to determine the sensitivity values.

At 110, MC samples are sorted by proximity to one or more limits of the design specification based on the sensitivity values to arrange the MC samples in an order. Those MC samples closest to the limits of the design specification are arranged first in the order.

At 112, a MC simulation is performed on the sorted MC samples. The MC simulation processes the MC samples closest to the boundary of the design specification first, and processes the MC samples until a stopping condition is reached. The stopping condition may be, for example, the processing of a predetermined number of MC samples.

Advantageously, by sorting the MC samples, the MC samples having the largest impact on the design specification are processed first during the MC simulation. This allows for a process variation (e.g., yield) to be determined by running the MC simulation on a percentage of the MC samples that is less than 100 percent. Collectively, the foregoing results in faster yield predictions and shorter design iterations since the critical electronic devices have the greatest impact on the MC simulation results.

While the methods described herein (e.g., methods 100, 400, 500, 600, 700, 800, and 900) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 2:
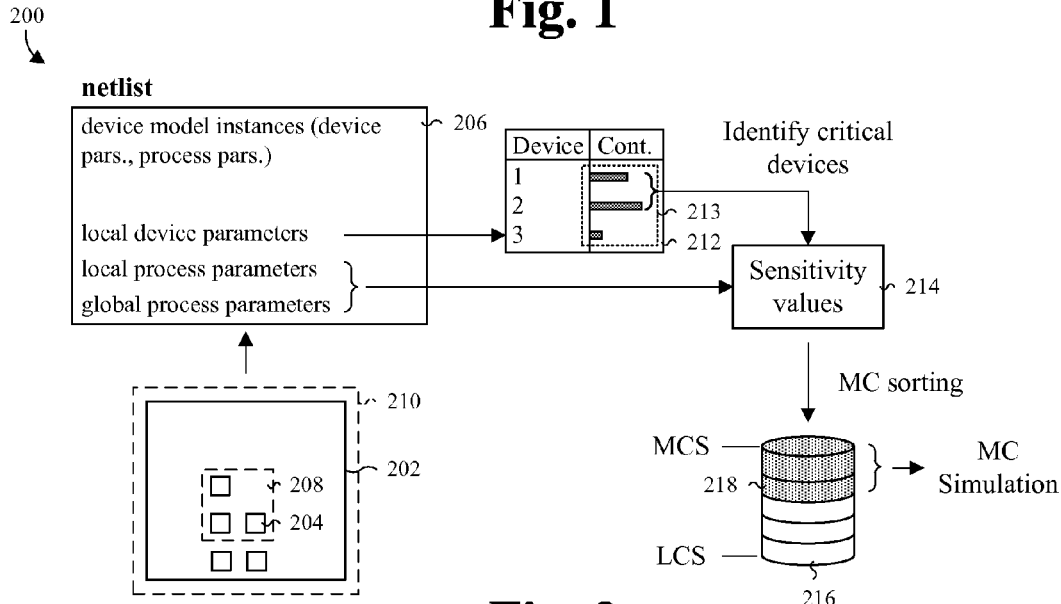
FIG. 2 illustrates a block diagram of some embodiments corresponding to the method of FIG. 1.

FIG. 2 illustrates a schematic view of some embodiments of performing a process variation analysis of an integrated circuit layout corresponding to the method of FIG. 1.

As shown in the schematic view 200, an integrated chip layout 202 comprises a plurality of electronic devices 204. A netlist 206 is generated from the integrated chip layout 202 (corresponding to Act 102 of FIG. 1). The netlist 206 is a text file that describes the electronic devices 204 and the interconnections between the electronic devices 204 within the integrated chip layout 202. The netlist 206 comprises device model instances that define relationships between terminals of a device. The netlist 206 further comprises local device parameters, local process parameters, and global process parameters. The local device and process parameters apply to one or more of the electronic devices 204 within a sub-region 208 of the integrated chip layout 202. The global process parameters apply to a region including the entire 210 integrated chip layout 202. The device module instances are a function of the global process parameters, and one or more of the local device parameters and the local process parameters.

The local device parameters are used to identify critical devices 212 (corresponding to act 106 of FIG. 1). The critical devices 212 are the devices with largest contributions 213 to one or more performance parameters of a design specification. The local and global process parameters of the critical devices are then used to determine sensitivity values 214 (corresponding to act 108 of FIG. 1).

The sensitivity values 214 are used to sort MC samples 216 (corresponding to act 110 of FIG. 1). The MC samples 216 are sorted from a most critical sample (MCS) that has a largest impact on a subsequent MC simulation to a least critical sample (LCS) that has a smallest impact on the subsequent MC simulation. A MC simulation is then performed using a subset 218 of the MC samples 216. In various embodiments, the number of MC samples used may vary until a stopping condition is reached (e.g., until a predetermined number of MC samples have been processed or until a pre-determined yield has been reached)

Figure 3:
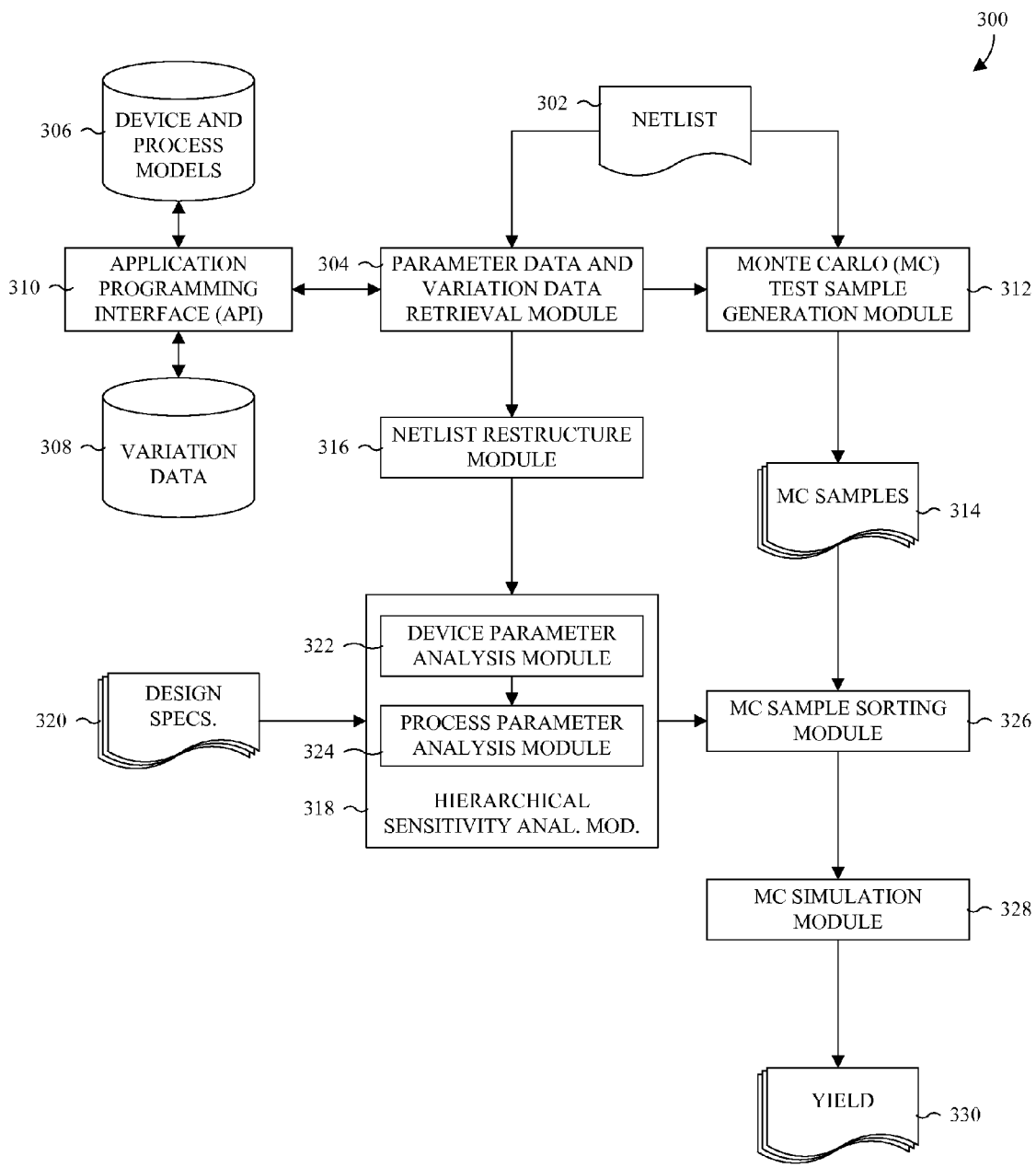
FIG. 3 illustrates a block diagram of a system for performing the method of FIG. 1.

With reference to FIG. 3, a block diagram 300 of some embodiments of a system for performing the method of FIG. 1 is provided.

As illustrated, a netlist 302 is received or otherwise generated. The netlist 302 describes electronic devices (e.g., resistors, capacitors, diodes, inductors, and transistors) and interconnections between the electronic devices. The netlist 302 describes the electronic devices and the interconnections by instances of models that define relationships between terminals (e.g., a gate terminal and source/drain terminals) of the device types. A model instance for an electronic device may include the size of the electronic device (e.g., a channel length, channel width, etc.) and node assignments for terminals of the electronic device. The relationships between terminals are quantified in terms of electrical properties, such as, for example, voltage, current, impedance, and frequency.

After receiving the netlist 302, parameter data is retrieved by a parameter retrieval module 304. The parameter retrieval module 304 is configured to retrieve the parameter data by device type from a models database 306 and to retrieve variation data from a variation data database 308. The model and variation data databases 306, 308 are typically generated through observation of manufactured samples of the device types. In some embodiment, the parameter data and the variation data are retrieved from the model and variation data databases 306, 308 through an application programming interface (API) 310.

The parameter data from the models database 306 describes device model parameters and process model parameters. The variation data from the variation data database 308 includes standard deviations of Gaussian probability distributions for the device and process model parameters. The device model parameters describe the structure or operation of device types and are used by device models to model relationships between terminals of the device types. For example, for a FinFET, the device model parameters may include variability in the threshold voltage, drain current for miscellaneous reasons, and/or in carrier mobility. The process model parameters describe a process for manufacturing device types and are used by process models to model relationships between terminals of the device types. For example, the process model parameters may include one or more of doping concentration, oxide thickness, deposition temperature, and diffusion depth. The device and/or process parameters may be local parameters or global parameters. A local parameter is a parameter with a value limited to a model instance (e.g., an individual electronic device of an integrated chip). A global parameter is a parameter with a scope encompassing all model instances (e.g., has a common value for all electronic devices of an integrated chip). In some embodiments, the device model parameters are local parameters, and the process model parameters are a mix of local and global parameters. In various embodiments, the device and/or process model parameters may also be deviation parameters or full-value parameters, and may be described as such in the parameter data. For example, for a FinFET, a full-value device parameter may be a threshold voltage, whereas a deviation device parameter may be a deviation from the threshold value.

The parameter data and, in some embodiments, the variation data are used by an MC sample generation module 312 to generate MC samples 314. The MC samples 314 comprise a vector including a value for each global process model parameter. Further, for each local process model parameter, the vector includes a value of the local process model parameter for each instance of a model using the local process model parameter. In some embodiments, a predetermined number of MC samples are generated randomly, subject to limits on the ranges of possible values determined from the variation data.

The parameter data and the variation data may also be used by a netlist restructure module 316 to restructure the netlist 302. Restructuring the netlist 302 includes amending each of the model instances to set the device and process model parameters for the device and process models of the model instance to initial values. Where a model parameter is a deviation parameter, the initial value of the parameter is zero. Where a model parameter is a full-value parameter, the initial value of the parameter is the mean of the parameter.

In some embodiments, the netlist 302 includes a hierarchical arrangement in which multiple sub-circuit instances refer to a same sub-circuit definition. In such embodiments, restructuring the netlist 302 further includes copying the sub-circuit definition and amending the multiple instances to identify individual sub-circuit definitions.

Following restructuring, a sensitivity analysis module 318 is configured to perform a hierarchical sensitivity analysis on the restructured netlist for one or more design specifications 320 (e.g., gain and/or bandwidth). The sensitivity analysis module 318 includes a device parameter analysis module 322 and a process parameter analysis module 324. The device parameter analysis module 322 is configured to perform a device parameter analysis to determine model instances describing devices critical to a design specification. The process parameter analysis module 324 is configured to perform a process parameter analysis to determine the impact of global process instance parameters, and local process instance parameters of critical model instances, on a design specification.

The device parameter analysis includes determining first baseline values for the performance parameters of the design specification by simulating the restructured netlist with the device models and with the device instance parameters set to zero for deviation parameters, and set to means for full-value parameters. A contribution value for each device instance parameter is then determined by measuring an amount of change in the performance parameters of the design specification when the device instance parameter is changed and the other device instance parameters remain set to initial values. After determining the contribution values, the device parameter analysis for a design specification concludes with selecting critical model instances with the highest contribution values are selected. For example, model instances corresponding to the device instance parameters with contributions exceeding a predetermined threshold or percentile may be selected.

The process parameter analysis for a design specification includes determining second baseline values for the performance parameters of the design specification by simulating the restructured netlist with the process models. This is to be contrasted with the device parameter analysis, which simulates the restructured netlist with the design models. The process parameter analysis also includes, for each global process instance parameter and for each local process instance parameter of the critical model instances, determining a sensitivity value describing how sensitive the performance parameters of the design specification are to the process instance parameter. The sensitivity value of a process instance parameter is determined by selecting a value for the process instance parameter based on the standard deviation of the process instance parameter (e.g., the standard deviation of the variation data for the corresponding process model parameter). The process instance parameter is then set to the selected value in the restructured netlist to form a new netlist, which is simulated, using the process models to predict second values for the performance parameters. Differences between the second values and the corresponding second baseline values are calculated and summed, optionally with weighting and/or normalization, to determine the sensitivity value.

After generating the MC samples 314 and performing the hierarchical sensitivity analysis, an MC sorting module 326 is configured to sort the MC samples 314 for the one or more design specifications 320 based on the sensitivity values. The sorting for a design specification includes determining probabilities of the MC samples and estimating values of the one or more performance parameters for the MC samples based on the sensitivity values. Scores are then determined for the MC samples based on the estimated values and the determined probabilities. The MC samples are then arranged in an order by score. Typically, the lowest scores are assigned to MC samples estimated to have the greatest deviations from means of the performance parameters.

With the MC samples 314 sorted, a MC simulation module 328 is configured to perform MC simulation for each of the one or more design specifications 320 (e.g., a voltage) from those closest to the limits of the design specification to those farthest from the limits until a stop condition (e.g., a predetermined number of MC samples, a predetermined yield, etc.) is met. The MC simulation is performed by setting process instance parameters to corresponding values of the MC sample in the restructured netlist to form a new netlist that is simulated with the process models to determine values for one or more performance parameters of the design specification. Performance parameter values of the netlist simulations are compared to the design specification and determinations are made as to whether the MC samples meet the design specification. Once the stopping condition is reached, the determinations are used to determine a final yield 330 (e.g., a ratio of MC samples that meet the design specification to the total number of MC samples processed). Additionally or alternatively, the determinations are used to determine a worst performing or best performing MC sample (e.g., a MC sample with performance parameter values deviating the most or the least from the design specification).

Figure 4:
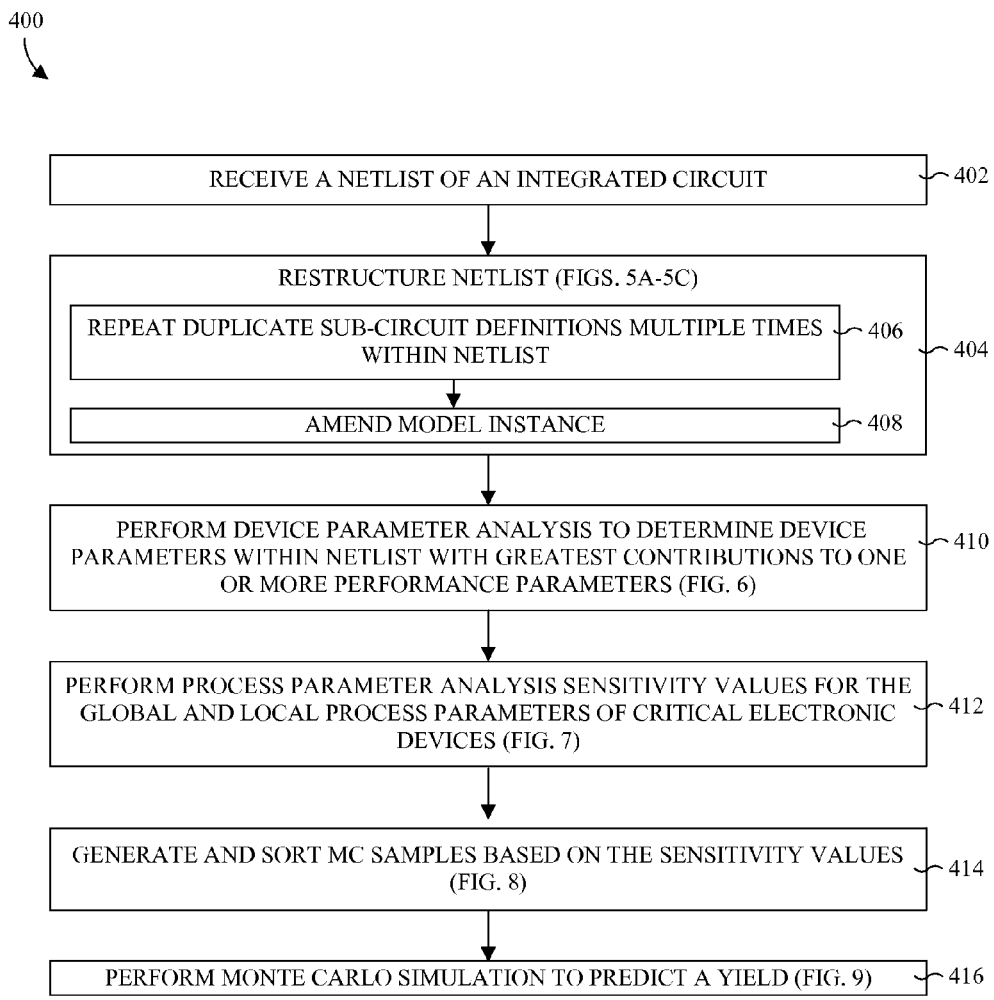
FIG. 4 illustrates a block diagram of some additional embodiments of a method of performing a process variation analysis of an integrated circuit.

FIG. 4 illustrates a flowchart 400 of some additional embodiments of a method for predicting a yield of an integrated circuit is provided.

At 402, a netlist describing electronic devices and the interconnections between the electronic devices is received.

At 404, the netlist is restructured. In some embodiments, restructuring the netlist comprises repeating duplicate sub-circuit definitions multiple times within netlist (Act 406) and including device parameters and process parameters of the electronic devices (Act 408). Some embodiments of a method of restructuring the netlist is described in greater detail below in FIGS. 5A-5C.

At 410, device parameter analysis is performed to identify critical electronic devices within the netlist, which make a largest contribution to one or more performance parameters. Some embodiments of a method of identifying critical electronic devices are described in greater detail below in FIG. 6.

At 412, process parameter analysis is performed to determine sensitivity values for global and local process parameters of the critical electronic devices. Some embodiments of a method of determining sensitivity values are described in greater detail below in FIG. 7.

At 414, MC samples are generated and sorted with proximity to one or more limits of the design specification based on the sensitivity values. Some embodiments of a method of sorting MC samples are described in greater detail below in FIG. 8.

At 416, a MC simulation is performed on the sorted MC samples to predict a yield. Some embodiments of a method of performing a MC simulation on sorted MC samples is described in greater detail below in FIG. 9.

Figure 5A:
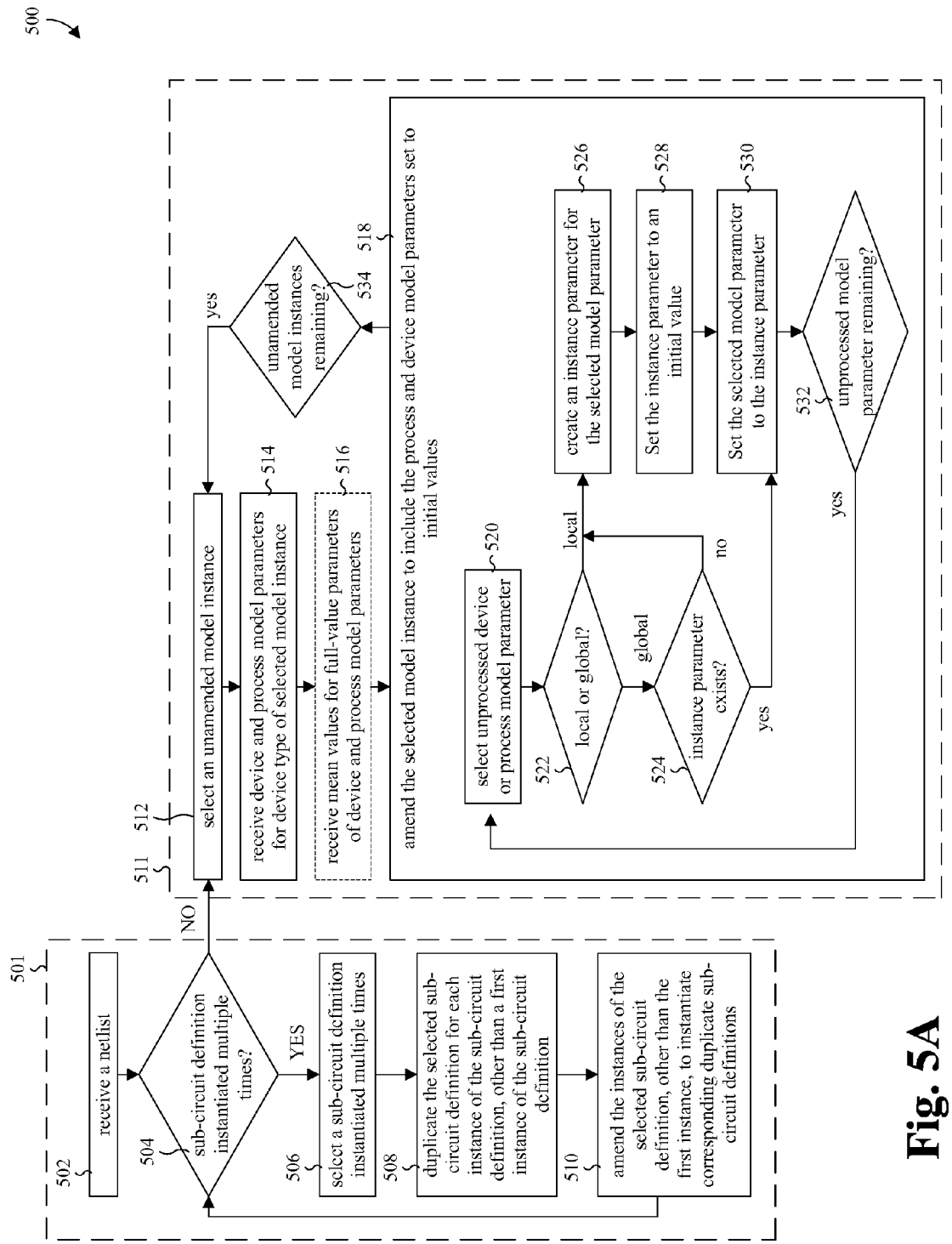
FIG. 5A illustrates a flowchart of some embodiments of a method for restructuring a netlist within the method of FIG. 4.

FIG. 5A illustrates a flowchart 500 of some embodiments of a method for restructuring a netlist within the method 400 of FIG. 4 (see, for example, 404 in FIG. 4). The flowchart 500 comprises a first section 501 corresponding to flattening of the netlist and a second section 511 corresponding to amending a model instance during restructuring As illustrated, a netlist is received at 502. Further, a determination is made at 504 as to whether the netlist includes any sub-circuit definitions instantiated multiple times. If there are any sub-circuit definitions instantiated multiple times, a sub-circuit definition repeated multiple times is selected at 506. The selected sub-circuit definition is then duplicated at 508 for each instance of the sub-circuit definition, other than a first instance of the sub-circuit definition. Further, the instances of the selected sub-circuit definition, other than the first instance, are amended at 510 to instantiate corresponding duplicate sub-circuit definitions. Thereafter, the sub-circuit determination at 504 is made again.

If there are not any sub-circuit definitions instantiated multiple times, the model instances are amended with device and process model parameters. This includes selecting at 512 an un-amended model instance. Thereafter, device model parameters and process model parameters are received at 514 for the device type of the selected model instance. Further, where the selected model instance includes full-value parameters, means are received at 516 for the full-value parameters. With the device and process parameters and, in some embodiments, the means, the selected model instance is amended at 518 to include the device and process model parameters set to initial values. The initial values of deviation parameters are zero, and the initial values of full-value parameters are the corresponding means.

In some embodiments, amending the selected model instance may be performed at 520-532. An unprocessed device or process model parameter is selected at 520. Further, a determination is made at 522 as to whether the selected model parameter is a local parameter or a global parameter. If the selected model parameter is a global parameter, a determination is made at 524 as to whether a corresponding instance parameter exists. If an instance parameter does not exist when the selected model parameter is a global parameter, or if the selected model parameter is a local parameter, an instance parameter is created at 526 for the selected model parameter. Further, the instance parameter is set at 528 to an initial value, and the selected model parameter is set at 530 to the instance parameter. If an instance parameter exists when the selected model parameter is a global parameter, the selected model parameter is set at 530 to the instance parameter.

With the selected model parameter set the instance parameter, a determination is made at 532 as to whether an unprocessed model parameters remains. If an unprocessed model parameter remains, an unprocessed device or process model parameter is selected at 520 and the foregoing repeats.

After amending the selected model instance, a determination is made at 534 as to whether there are any remaining model instances that are un-amended. If there are remaining model instances, an un-amended model instance is selected at 512 and the foregoing process repeats. Otherwise, the restructuring concludes.

With reference to FIGS. 5B & C, netlists 536, 546, 562, 568 according to some embodiments are provided to illustrate the method of FIG. 5A. Although FIGS. 5B & C are employed to illustrate the method of FIG. 5A, it will be appreciated that the structures disclosed in FIGS. 5B & C are not limited to the method, but instead may stand alone as structures independent of the method. Similarly, although the methods are described in relation to FIGS. 5B & C, it will be appreciated that the method are not limited to the structures disclosed in FIGS. 5B & C, but instead may stand alone independent of the structures disclosed in FIGS. 5B-5C.

FIG. 5B illustrates some embodiments of a flat netlist 536 before restructuring.

The flat netlist 536 is a netlist without sub-circuit instances. The flat netlist 536 includes a sub-circuit definition 538 including a name of "top" and node assignments. Further, the sub-circuit definition 538 includes a plurality of model instances 540, 542, 544. The model instances 540, 542, 544 include names (e.g., "xn1"), node assignments, device types (e.g., "nch_svt_mac"), and size parameters.

FIG. 5B also illustrates some embodiments of a flat netlist 546 after restructuring.

Restructuring the flat netlist 536 causes the sub-circuit definition 538 to be amended for each model instances 540', 542', 544'. For example, the restructured netlist includes a restructured sub-circuit definition 538' including a plurality of restructured model instances 540', 542', 544'.

Restructuring the flat netlist 536 also causes model instances to be amended with device and process model parameters. For example, the restructured model instances 540', 542', 544' include global process model parameters 548, local process model parameters 550, and device model parameters 552. For example, a restructured sub-circuit definition 538' includes: global process model parameters 548 named "par1" and "par2"; local process model parameters 550 named "parl1" and "parl2"; and a device model parameter 552 named "delvtrand".

In some embodiments, the device and process model parameters 548, 550, 552 may be set to user-defined parameters 554 of the restructured sub-circuit definition 538', and indirectly initialized to zero through the user-defined parameters 554. The user-defined parameters 554 include device instance parameters 556, local process instance parameters 558 unique to model instances using the model parameter, and global process instance parameters 560 respectively corresponding to the device model parameters 552, the local process model parameters 550, and the global process model parameters 548.

FIG. 5C illustrates some embodiments of a folded, hierarchical netlist 562 before restructuring.

The hierarchical netlist 562 comprises multiple instances of the same sub-circuit definition. For example, the hierarchical netlist 562 comprises a first sub-circuit definition 564 and a second sub-circuit definition 566. The first sub-circuit definition 564 includes a name of "A", node assignments, and a plurality of model instances 568, 570, 572. The second sub-circuit definition 566 includes a name of "top", node assignments, and a plurality of instances 574, 576 of the first sub-circuit definition 564, as well as a model instance 578. The model instances 568, 570, 572, and 578 include names (e.g., "xn1"), node assignments, device types (e.g., "nch_s-vt_mac"), and size parameters. The first sub-circuit instances 574, 576 include names (e.g., "xi1"), an identifier of the first sub-circuit definition 564 (e.g., the name of "A"), and node assignments.

FIG. 5C also illustrates some embodiments of an unfolded, hierarchical netlist 580 after restructuring (i.e., a restructured folded, hierarchical netlist).

The unfolded, hierarchical netlist 580 is a netlist limited to one instantiation per sub-circuit definition. The restructured netlist includes a first sub-circuit definition 582 and a second sub-circuit definition 584. The first and second sub-circuit definitions 582, 584 are copies of a pre-restructuring sub-circuit definition that was instantiated multiple times. The first and second sub-circuit definitions 582, 584 include node assignments and respectively include names of "top.xi1.A" and "top.xi2.A". Further, the first and second sub-circuit definitions 582, 584 respectively include a first plurality of model instances 586, 588, 590 and a second plurality of model instances 592, 594, 595. The model instances 586, 588, 590, 592, 594, 595 include global process model parameters 596, local process model parameters 597, and device model parameters 598 set to parameters of a plurality of user-defined parameters 599.

The restructured netlist further includes a third, restructured sub-circuit definition 566'. The third sub-circuit definition 566' includes a plurality of restructured sub-circuit instances 574', 576' and a restructured model instance 578'. The restructured sub-circuit instances 574', 576' respectively reference the first and second sub-circuit definitions 582, 584. Before restructuring, the restructured sub-circuit instances 574', 576' referenced the same sub-circuit definition. Further, the restructured model instance 578' includes global process model parameters, local process model parameters, and device model parameters set to parameters of the plurality of user-defined parameters 599.

Figure 6:
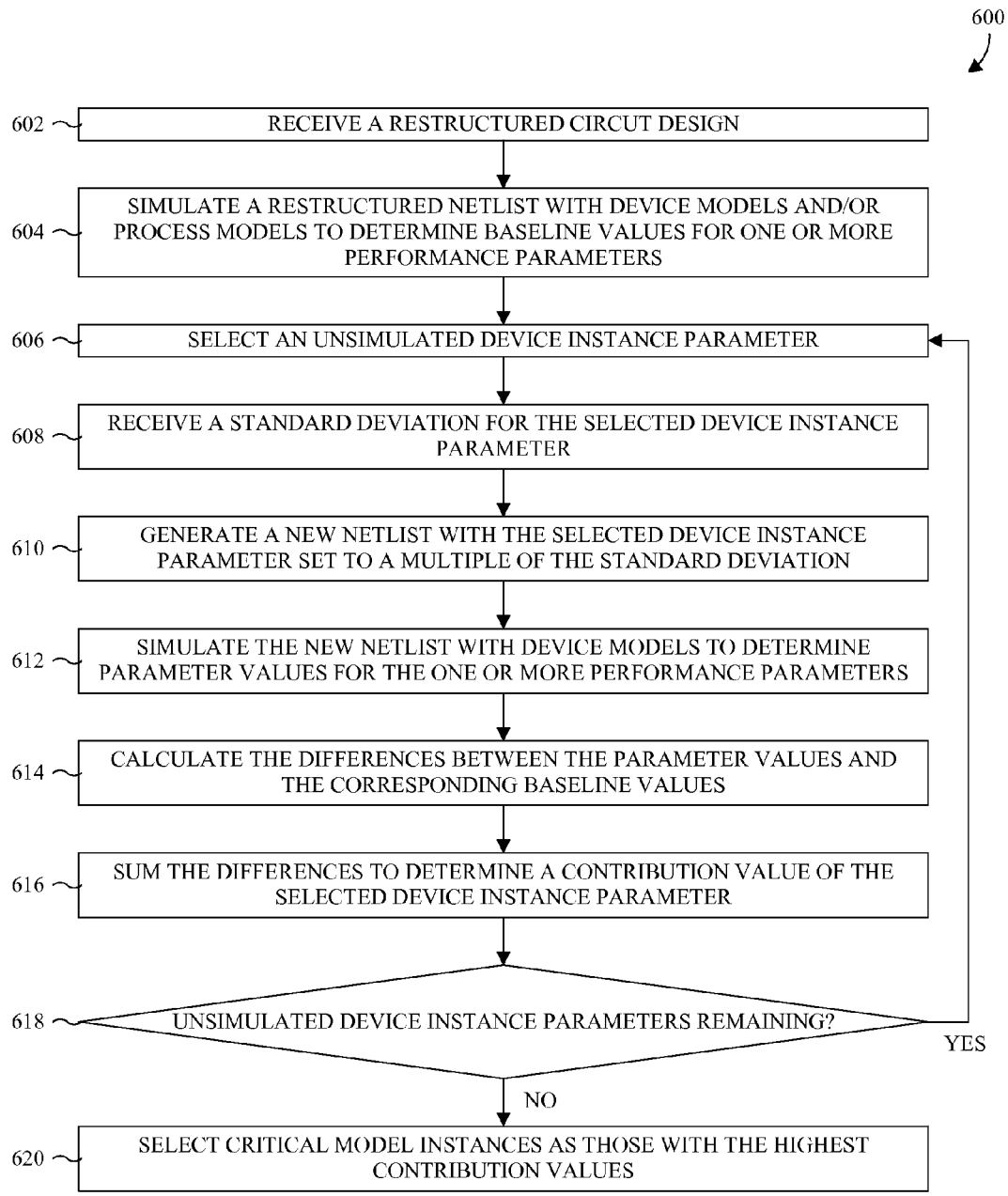
FIG. 6 illustrates a flowchart of some embodiments of a method for performing a device parameter analysis within the method of FIG. 4.

With reference to FIG. 6, a flowchart 600 of some embodiments of a method for performing a device parameter analysis within the method 400 of FIG. 4 (see, for example, 410 in FIG. 4) is provided. As illustrated, a restructured netlist is received at 602. The restructured netlist is simulated at 604 with device models to determine baseline values for one or more performance parameters. Further, the device instance parameters are simulated, typically one at a time.

To simulate the device instance parameters, an un-simulated device instance parameter is selected at 606. With the un-simulated device parameter selected at 606, a standard deviation is received at 608 for a Gaussian probability distribution of the selected device instance parameter. Further, a new netlist is generated at 610 from the restructured netlist. The new netlist includes the selected device instance parameter set to a multiple of the standard deviation. The new netlist is simulated at 612 with device models to determine parameter values for the one or more performance parameters. The differences between the parameter values and the corresponding baseline values are calculated at 614.

Further, the differences are summed at 616 to determine a contribution value for the selected device instance parameter.

After summing the differences at 616, a determination is made at 618 as to whether there are any un-simulated device instance parameters remaining. If there are any un-simulated device instance parameters remaining, an un-simulated device instance parameter is selected at 606 and the foregoing process repeats. Otherwise, critical model instances are selected at 620 as those model instances with the highest contribution values. For example, a predetermined number or percentile of the most contributing model instances are selected.

Figure 7:
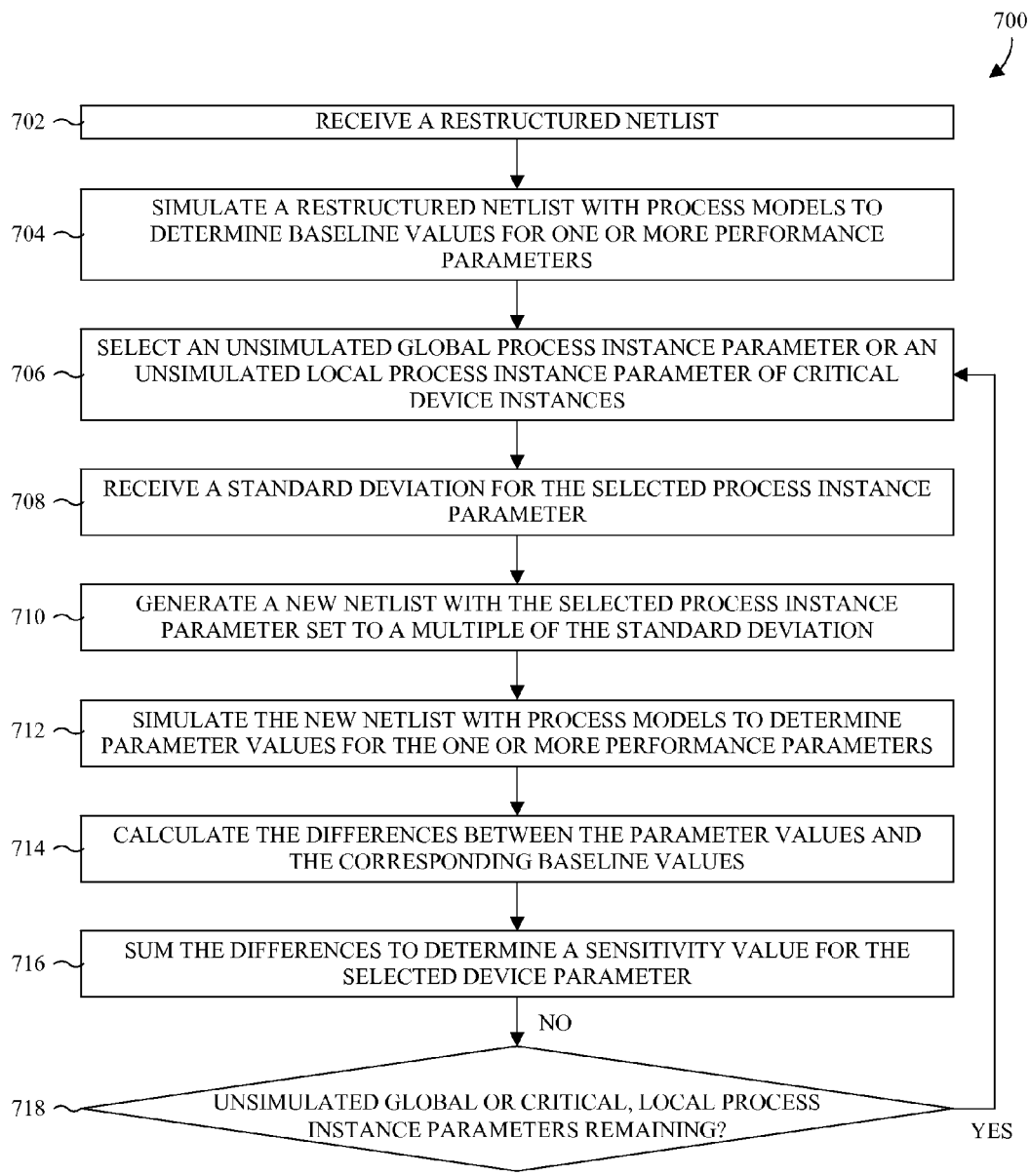
FIG. 7 illustrates a flowchart of some embodiments of a method for performing a process parameter analysis within the method of FIG. 4.

With reference to FIG. 7, a flowchart 700 of some embodiments of a method for performing a process parameter analysis within the method 400 of FIG. 4 (see, for example, 412 in FIG. 4) is provided. As illustrated, a restructured netlist is received at 702. The restructured netlist is simulated at 704 with process models to determine baseline values for one or more performance parameters. Further, the global process instance parameters and the local process instance parameter of critical model instances are simulated, typically one at a time.

To simulate the process instance parameters, an un-simulated global process instance parameter or an un-simulated local process instance parameter of critical model instances is selected at 706. With the un-simulated process instance parameter selected at 706, a standard deviation is received at 708 for a Gaussian probability distribution of the selected process instance parameter. Further, a new netlist is generated at 710 from the restructured netlist with the selected process parameter set to a multiple of the standard deviation value. The new netlist is simulated with process models to determine parameter values for the one or more performance parameters at 712. The differences between the parameter values and the corresponding baseline values are calculated at 714 and summed at 716 to determine a sensitivity value. Thereafter, a determination is made at 718 as to whether there are any un-simulated global process instance parameters or local process instance parameters of critical electronic devices. If there are, a new parameter is selected at 706 and the foregoing process repeats. Otherwise, the process concludes.

Figure 8:
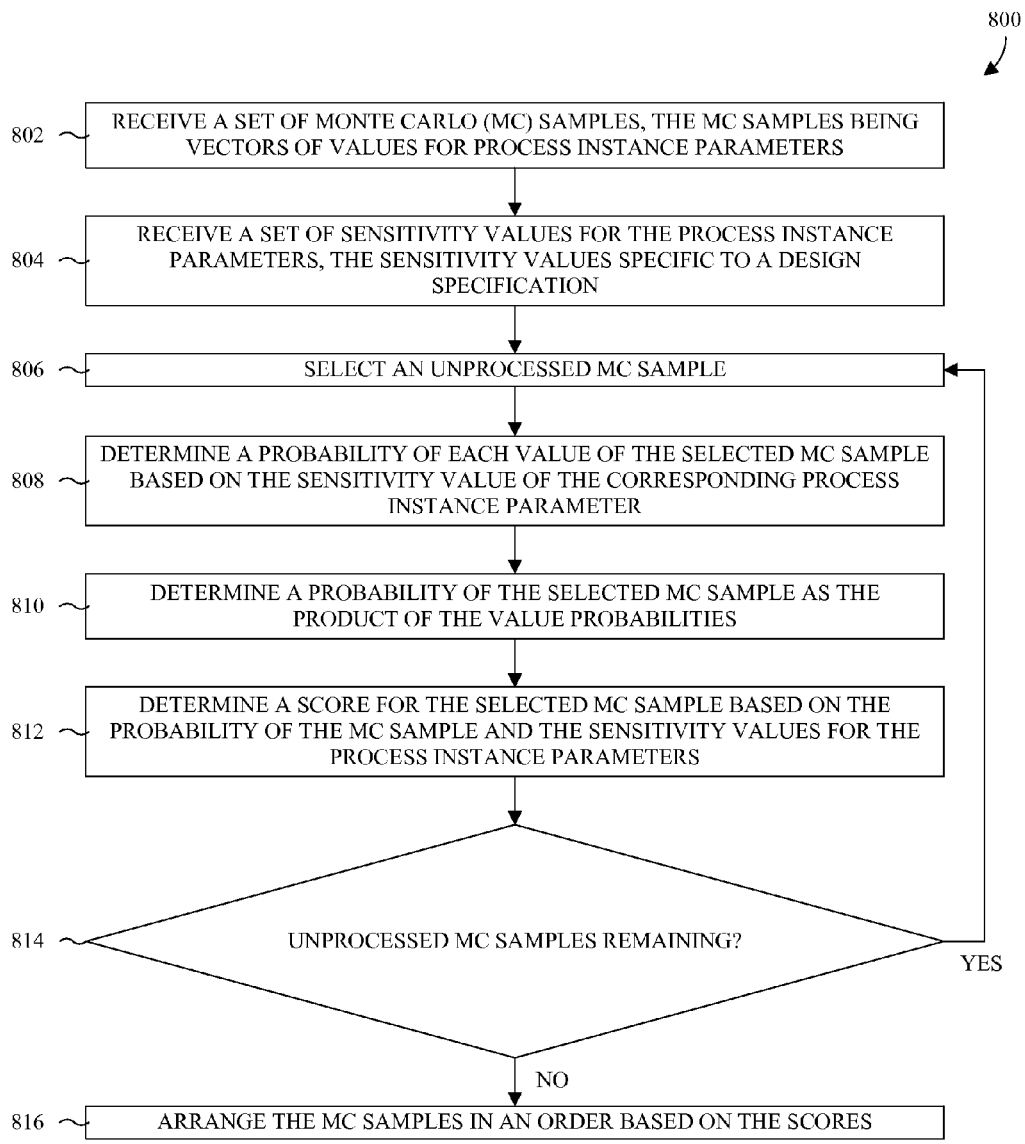
FIG. 8 illustrates a flowchart of some embodiments of a method for sorting Monte Carlo (MC) samples within the method of FIG. 4.

With reference to FIG. 8, a flowchart 800 of some embodiments of a method for sorting MC samples within the method 400 of FIG. 4 (see, for example, 414 in FIG. 4) is provided. The method is performed for a design specification. As illustrated, a set of MC samples are received at 802 and a set of sensitivity values are received at 804. The MC samples are vectors of values for process instance parameters. The sensitivity values correspond to the process instance parameters and are specific to the design specification. Thereafter, the MC samples are processed to assign scores to the MC samples.

To process the MC samples, an unprocessed MC sample is selected at 806. A probability is determined at 808 for each value of the selected MC sample based on the sensitivity value of the corresponding process instance parameter. Further, a probability of the selected MC sample is determined at 810 as the product of the value probabilities, and a score is determined at 812 for the selected MC sample based on the probability of the selected MC sample and the sensitivity values for the process parameters.

After determining the score of the selected MC sample, a determination is made at 814 as to whether there are any unprocessed MC samples remaining. If there are remaining MC samples, an unprocessed MC sample is selected at 806 and the foregoing process repeats. Otherwise, the MC samples are arranged in an order based on score at 816. For example, the MC samples are typically arranged in the order from lowest score to highest score.

Figure 9:
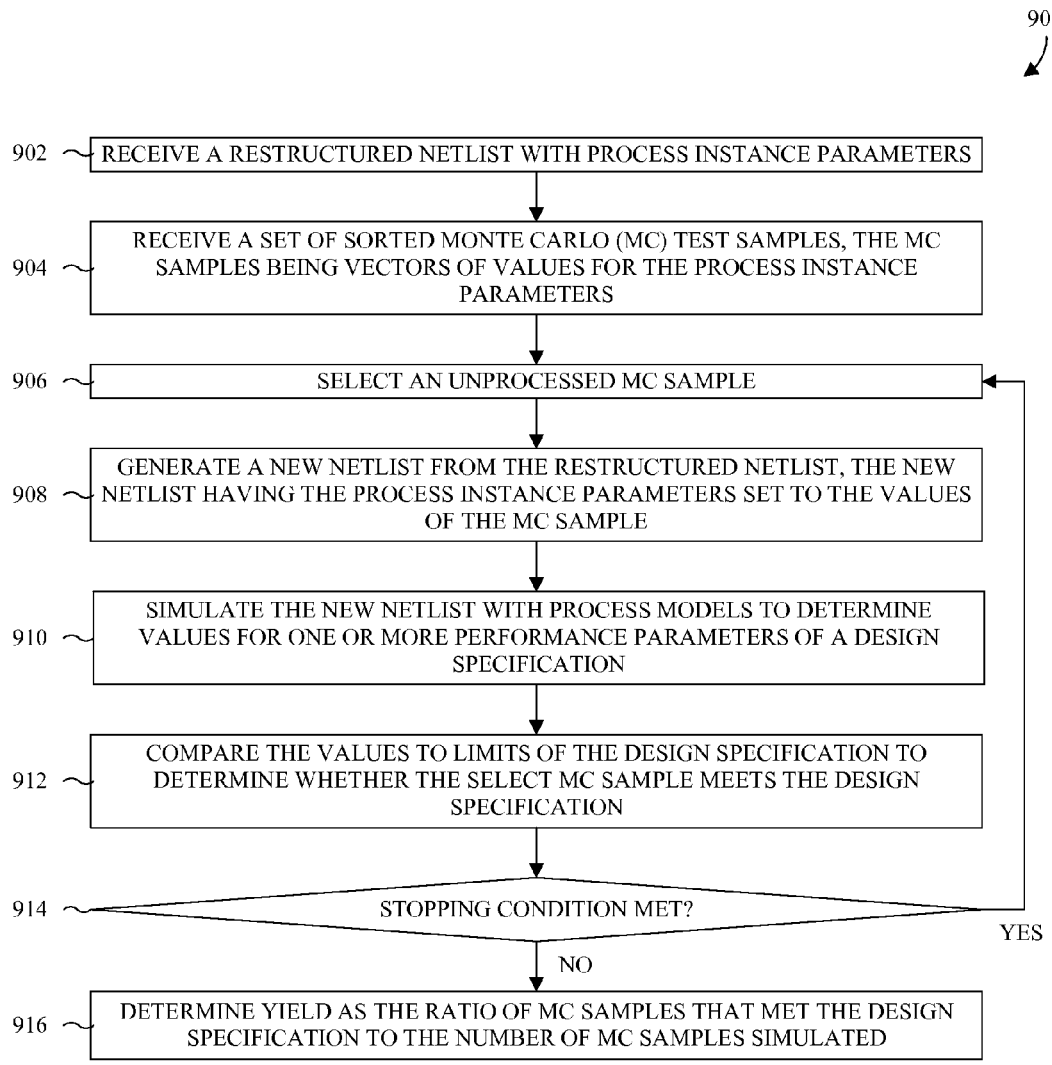
FIG. 9 illustrates a flowchart of some embodiments of a method for performing a MC simulation within the method of FIG. 4.

With reference to FIG. 9, a flowchart 900 of some embodiments of a method for performing a MC simulation within the method 400 of FIG. 4 (see, for example, 416 in FIG. 4) is provided. The method is performed for a design specification. As illustrated, a restructured netlist with process instance parameters is received at 902. Further, a set of sorted MC samples is received at 904. The MC samples are vectors of values for the process instance parameters. Thereafter, the MC samples are processed to predict values for one or more performance parameters of the design specification. The MC samples are processed according to the sorting of the MC sample set until a stopping condition is met.

To process the MC samples, an unprocessed MC sample is selected at 906. A new netlist is then generated at 908 for the selected MC sample from the restructured netlist. The new netlist has the process instance parameters set to the values of the selected MC sample. The new netlist is simulated at 910 with process models to determine values for the one or more performance parameters. The determined values are compared at 912 to limits of the design specification to determine whether the selected MC sample meets the design specification.

After determining whether the selected MC sample meets the design specification, a determination is made at 914 as to whether the stopping condition is met. The stopping condition may be, for example, the processing of all of the MC samples or the processing of a predetermined number or percentile of the MC samples. If the stopping condition is unmet, an unprocessed MC sample is selected at 906 and the foregoing process repeats. Otherwise, a yield is determined at 916 for the restructured netlist as the ratio of MC samples that met the design specification to the number of MC samples processed.

Figure 10:
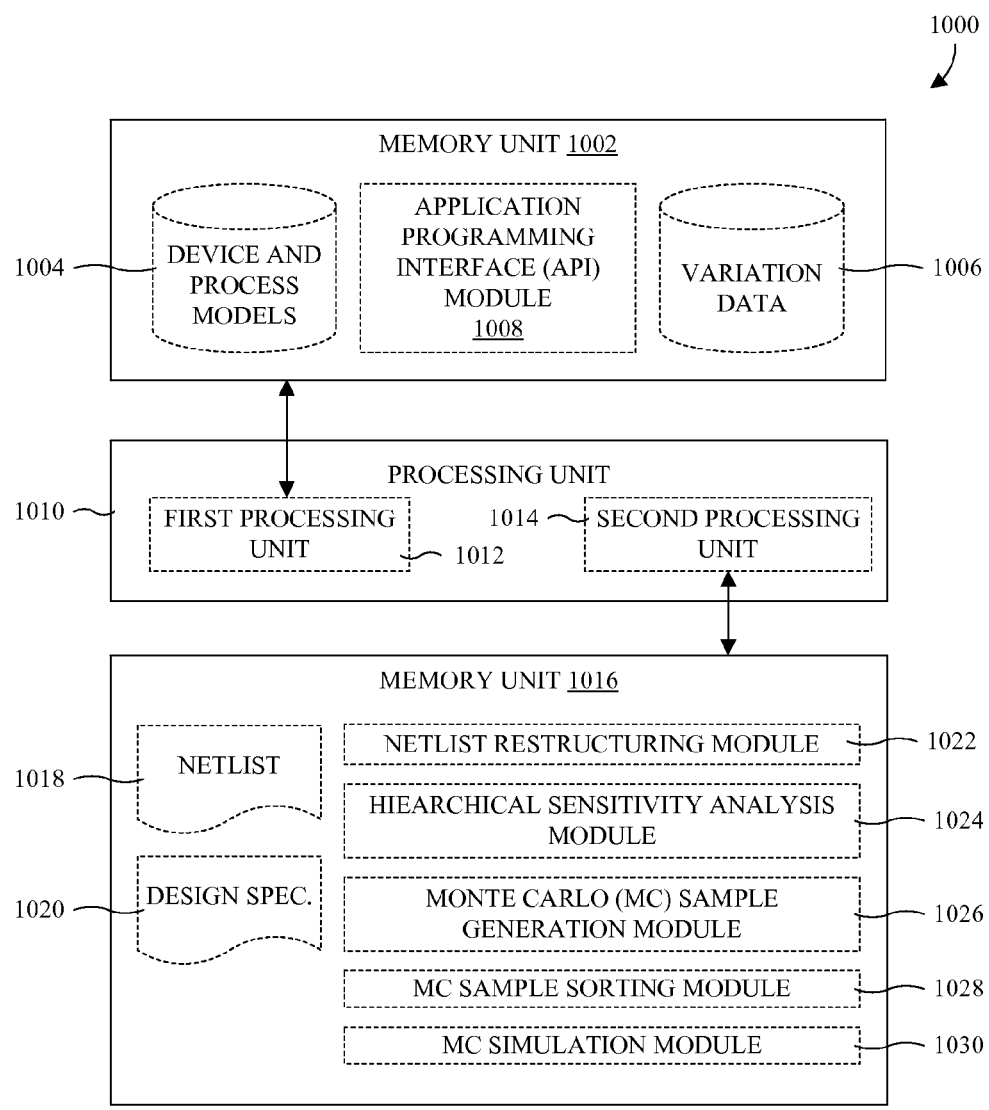
FIG. 10 illustrates a schematic view of some embodiments of a system for performing a process variation analysis of an integrated circuit corresponding to the method of FIG. 4.

With reference to FIG. 10, a diagram 1000 of some embodiments of a system for process variation analysis of an integrated circuit corresponding to the method of FIG. 4 is provided. As illustrated, a first memory unit 1002 stores a device and process models database 1004, as well as a variation data database 1006. Further, the first memory unit 1002 stores first computer executable instructions including an API module 1008 configured to provide an API for accessing the databases 1004, 1006.

A second memory unit 1016 stores a netlist 1018 for an integrated circuit and a design specification 1020. Further, the second memory unit 1016 stores second computer executable instructions to predict a yield of the netlist 1018 for the design specification 1020. The second computer executable instructions include a netlist restructuring module 1022, a hierarchical sensitivity analysis module 1024, a MC sample generation module 1026, a MC sample sorting module 1028, and a MC simulation module 1030. The netlist restructuring module 1022 may, for example, be configured to carry out Act 104 of FIG. 1 and/or Act 404 of FIG. 4. The hierarchical sensitivity analysis module 1024 may, for example, be configured to carry out Acts 106, 108 of FIG. 1 and/or Acts 410, 412 of FIG. 4. The MC sample generation module 1026 may, for example, be configured to carry out Act 414 of FIG. 4. The MC sample sorting module 1028 may, for example, be configured to carry out Act 110 of FIG. 1 and/or Act 414 of FIG. 4. The MC simulation module 1030 may, for example, be configured to carry out Act 112 of FIG.

1 and/or Act 416 of FIG. 4. The second memory unit 1016 includes one or more non-transitory electronic storage mediums.

A processing unit 1010 is communicatively coupled to the first memory unit 1002 and to the second memory unit 1016, typically by a data bus. The processing unit 1010 includes a first processing unit 1012 and a second processing unit 1014 respectively for executing the first and second computer executable instructions. The first and second processing units 1012, 1014 may be embodied by, for example, electronic devices. In use, the processing unit 1010 executes the second computer executable instructions to perform the respective Acts of the second memory unit modules 1022, 1024, 1026, 1028, 1030, and to carry out yield prediction on the netlist 1018. Further, the processing unit 1010 accesses the databases 1004, 1006 according to the API.

Thus, as can be appreciated from above, the present disclosure provides a method for process variation analysis of an integrated circuit. A netlist is generated describing electronic devices of an integrated circuit in terms of device parameters and process parameters. The process parameters include local process parameters individual to the electronic devices and global process parameters common to the electronic devices. Critical electronic devices are identified having device parameters with greatest contributions to a performance parameter of a design specification of the integrated circuit. Sensitivity values are determined for the global process parameters and local process parameters of the critical electronic devices. The sensitivity values represent how sensitive the one or more performance parameters are to variations in the global and local process parameters of the critical electronic devices. MC samples are sorted based on the sensitivity values.

In other embodiments, the present disclosure provides a system for process variation analysis of an integrated circuit. One or more memory units are configured to store a netlist describing electronic devices of an integrated circuit in terms of device parameters and process parameters of the electronic devices. The process parameters include local process parameters individual to the electronic devices and global process parameters common to the electronic devices. A hierarchical sensitivity module is configured to identify critical electronic devices having device parameters with greatest contributions to one or more performance parameters of a design specification. Further, the hierarchical sensitivity module is configured to determine sensitivity values for the global process parameters and local process parameters of the critical electronic devices. The sensitivity values represent how sensitive the one or more performance parameters are to variations in the global process parameters and local process parameters of critical electronic devices. A Monte Carlo (MC) sample sorting module is configured to sort MC samples based on the sensitivity values.

In yet other embodiments, the present disclosure provides a method for process variation analysis of an integrated circuit. A netlist is received describing electronic devices of an integrated circuit. The netlist is restructured to include device parameters and process parameters respectively used by device and process models to model the electronic devices. The process parameters include local process parameters individual to the electronic devices and global process parameters common to the electronic devices. Critical electronic devices are identified having device parameters with greatest contributions to one or more performance parameters of a design specification. Sensitivity values are determined for the global process parameters and local process parameters of the critical electronic devices. The sensitivity values represent how sensitive the one or more performance parameters are to variations in the global process parameters and local process parameters of critical electronic devices. MC samples are sorted based on the sensitivity values. A MC simulation is performed on the sorted MC samples. The MC simulation processes MC samples proximate to one or more limits of the design specification first.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for process variation analysis of an integrated circuit, the method comprising:
generating a netlist describing electronic devices of an integrated circuit in terms of device parameters and process parameters, wherein the process parameters include local process parameters individual to the electronic devices and global process parameters common to the electronic devices;
identifying critical electronic devices having device parameters with greatest contributions to one or more performance parameters of a design specification, wherein the design specification corresponds to the integrated circuit;
determining sensitivity values for the global process parameters and local process parameters of the critical electronic devices, wherein the sensitivity values represent how much the one or more performance parameters change in response to variations in the global process parameters and the local process parameters of the critical electronic devices;
sorting Monte Carlo (MC) samples, wherein the MC samples are vectors of values for the process parameters, and wherein the sorting is based on the sensitivity values and the values of the MC samples; performing a MC simulation on the sorted MC samples; and
manufacturing the integrated circuit selectively depending on results of the MC simulation.

2. The method according to claim 1, wherein the critical electronic devices are identified based upon device parameters that are individual to the electronic devices.

3. The method according to claim 1, further including:
receiving an initial netlist describing the electronic devices; and
restructuring the initial netlist into the netlist, wherein restructuring includes amending the initial netlist to include the device parameters and the process parameters.

4. The method according to claim 3, wherein the initial netlist includes a sub-circuit definition and multiple instances of the sub-circuit definition, and wherein restructuring further includes:
duplicating the sub-circuit definition for each instance of the sub-circuit definition, other than a first instance of the sub-circuit definition, to generate duplicate sub-circuit definitions; and amending the instances of the sub-circuit definition, other than the first instance, to instantiate the duplicate sub-circuit definitions.

5. The method according to claim 1, wherein determining sensitivity values includes:
   simulating the netlist using process models of the electronic devices to determine baseline values of the one or more performance parameters, wherein the process models model the electronic devices based on the process parameters;
   setting the global process parameters and the local process parameters of the critical electronic devices one at a time in the netlist to form new netlists corresponding to the global process parameters and the local process parameters of the critical electronic devices;
   simulating the new netlists using the process models to determine parameter values of the one or more performance parameters for the global process parameters and the local process parameters of the critical electronic devices;
   determining differences between the baseline values and corresponding parameter values; and
   grouping and summing the differences by process parameter to determine the sensitivity values for the global and the local process parameters of the critical electronic devices.

6. The method according to claim 5, wherein setting the global process parameters and the local process parameters of the critical electronic devices includes:
   receiving standard deviations of Gaussian probability distributions corresponding to the global process parameters and the local process parameters of the critical electronic devices; and
   setting the global process parameters and the local process parameters of the critical electronic devices to a predetermined multiple of the corresponding standard deviations.

7. The method according to claim 1, wherein identifying critical electronic devices includes:
   simulating the netlist using device models of the electronic devices to determine baseline values of the one or more performance parameters, wherein the device models model the electronic devices based on the device parameters;
   setting the device parameters one at a time in the netlist to form new netlists corresponding to the device parameters;
   simulating the new netlists using the device models to determine parameter values of the one or more performance parameters for the device parameters;
   determining differences between the baseline values and corresponding parameter values;
   grouping and summing the differences by device parameter to determine contribution values for the device parameters; and
   selecting one or more electronic devices associated with largest contributions values.

8. The method according to claim 7, wherein setting the device parameters includes:
   receiving standard deviations of Gaussian probability distributions corresponding to the device parameters; and
   setting the device parameters to a predetermined multiple of the corresponding standard deviations.

9. The method according to claim 1, wherein sorting MC samples includes:
   determining probabilities of the MC samples occurring;
   estimating values of the one or more performance parameters for the MC samples based on the sensitivity values;
   determining scores for the MC samples based on the estimated values and the probabilities; and
   arranging the MC samples in an order by the scores.

10. The method according to claim 1, wherein determining the sensitivity values comprises, for each of the local process parameters of the critical electronic devices, simulating the netlist with the local process parameter set to a test value and remaining process parameters set to baseline values, and wherein the sensitivity values are not determined for local process parameters of non-critical electronic devices.

11. A system for process variation analysis of an integrated circuit, the system comprising:
   one or more memory units configured to store a netlist describing electronic devices of an integrated circuit in terms of device parameters and process parameters of the electronic devices, wherein the process parameters include local process parameters individual to the electronic devices and global process parameters common to the electronic devices;
   a hierarchical sensitivity module configured to:
      identify critical electronic devices in the netlist as electronic devices having device parameters with greatest contributions to one or more performance parameters of a design specification; and
      determine sensitivity values for the global process parameters and local process parameters of the critical electronic devices, wherein the sensitivity values represent how much the one or more performance parameters change in response to variations in the global process parameters and the local process parameters of the critical electronic devices;
   a Monte Carlo (MC) sample sorting module configured to sort MC samples, wherein the MC samples are vectors of values for the process parameters, and wherein the sorting is based on the sensitivity values and the values of the MC samples; a MC simulation module configured to perform a MC simulation on the sorted MC samples; and
   a semiconductor substrate on which the integrated circuit is manufactured, wherein the integrated circuit is selectively manufacturing depending on results of the MC simulation.

12. The system according to claim 11, further including:
   one or more memory units configured to store device and process models of the electronic devices respectively based on the device parameters and the process parameters, to store an application programming interface (API) module, and to store the netlist, the hierarchical sensitivity module, and the MC sample sorting module; and
   one or more processing units configured to execute computer executable instructions of the API module to provide an interface to the device and process models, and to execute computer executable instructions of the hierarchical sensitivity module and the MC sample sorting module to analyze process variations of the integrated circuit with the device and process models.

13. The system according to claim 11, further including:
   a netlist restructuring module configured to:
   receive an initial netlist describing the electronic devices of the integrated circuit; and
   restructure the initial netlist into the netlist, wherein restructuring includes amending the initial netlist to include the device parameters and the process parameters of the electronic devices.

14. The system according to claim 11, wherein the hierarchical sensitivity module is further configured to:
simulate the netlist using process models of the electronic devices to determine baseline values of the one or more performance parameters, wherein the process models model the electronic devices based on the process parameters;
set the global process parameters and the local process parameters of the critical electronic devices one at a time in the netlist to form new netlists corresponding to the global process parameters and the local process parameters of the critical electronic devices;
simulate the new netlists using the process models to determine parameter values of the one or more performance parameters for the global process parameters and the local process parameters of the critical electronic devices;
determine differences between the baseline values and corresponding parameter values; and
group and sum the differences by process parameter to determine the sensitivity values for the global process parameters and the local process parameters of the critical electronic devices.

15. The system according to claim 14, wherein the hierarchical sensitivity module is further configured to:
receive standard deviations of Gaussian probability distributions corresponding to the global process parameters and the local process parameters of the critical electronic devices; and
set the global process parameters and the local process parameters of the critical electronic devices to a predetermined multiple of the corresponding standard deviations.

16. The system according to claim 11, wherein the hierarchical sensitivity module is further configured to:
simulate the netlist using device models of the electronic devices to determine baseline values of the one or more performance parameters, wherein the device models model the electronic devices based on the device parameters;
set the device parameters one at a time in the netlist to form new netlists corresponding to the device parameters;
simulate the new netlists using the device models to determine parameter values of the one or more performance parameters for the device parameters;
determine differences between the baseline values and corresponding parameter values;
group and sum the differences by device parameter to determine contribution values for the device parameters; and
select one or more electronic devices associated with largest contributions values.

17. The system according to claim 16, wherein the hierarchical sensitivity module is further configured to:
receive standard deviations of Gaussian probability distributions corresponding to the device parameters; and
set the device parameters to a predetermined multiple of the corresponding standard deviations.

18. The system according to claim 11, wherein identifying the critical electronic devices comprises, for each of the device parameters, simulating the netlist with the device parameter set to a test value and remaining device parameters set to baseline values.

19. A method for process variation analysis of an integrated circuit, the method comprising:
receiving a netlist describing electronic devices of an integrated circuit;
restructuring the netlist to include device parameters and process parameters respectively used by device and process models to model the electronic devices, wherein the process parameters include local process parameters individual to the electronic devices and global process parameters common to the electronic devices;
identifying critical electronic devices having device parameters with greatest contributions to one or more performance parameters of a design specification;
after identifying the critical electronic devices, determining sensitivity values individual to the global process parameters and individual to local process parameters of the critical electronic devices, wherein the sensitivity values represent how much the one or more performance parameters change in response to variations in the global process parameters and the local process parameters of the critical electronic devices;
sorting Monte Carlo (MC) samples, wherein the MC samples are vectors of values for the process parameters, and wherein the sorting is based on the sensitivity values and the values of the MC samples;
performing a MC simulation on the sorted MC samples, wherein the MC simulation processes MC samples proximate to one or more limits of the design specification first; and
manufacturing the integrated circuit on a semiconductor substrate selectively depending upon results of the MC simulation.

* * * * *